(12) United States Patent
Sasaki et al.

(10) Patent No.: US 7,321,418 B2
(45) Date of Patent: Jan. 22, 2008

(54) STAGE APPARATUS, EXPOSURE APPARATUS, AND DEVICE MANUFACTURING METHOD

(75) Inventors: Yasuhito Sasaki, Utsunomiya (JP);
Yoshikazu Miyajima, Utsunomiya (JP);
Naosuke Nishimura, Utsunomiya (JP);
Hideo Tanaka, Utsunomiya (JP);
Toshihiko Nishida, Utsunomiya (JP)

(73) Assignee: Canon Kabushiki Kaisha

( * ) Notice: Subject to any disclaimer, the term of this patent is extended or adjusted under 35 U.S.C. 154(b) by 134 days.

(21) Appl. No.: 11/249,700

(22) Filed: Oct. 13, 2005

(65) Prior Publication Data

US 2006/0082754 A1 Apr. 20, 2006

(30) Foreign Application Priority Data

Oct. 14, 2004 (JP) ............................. 2004-299785

(51) Int. Cl.
*G03B 27/58* (2006.01)
*G03B 27/42* (2006.01)
*G03B 27/32* (2006.01)
*H02K 41/00* (2006.01)

(52) U.S. Cl. ........................... 355/72; 355/53; 355/77; 310/12

(58) Field of Classification Search ............... 355/53, 355/72, 75, 77; 310/12; 318/135, 625
See application file for complete search history.

(56) References Cited

U.S. PATENT DOCUMENTS

| 5,182,615 | A | * | 1/1993 | Kurosawa et al. | .......... 356/400 |
| 5,504,407 | A | * | 4/1996 | Wakui et al. | .......... 318/568.17 |
| 6,028,376 | A | | 2/2000 | Osanai | |
| 6,414,742 | B1 | | 7/2002 | Korenaga | |
| 6,917,412 | B2 | * | 7/2005 | Poon et al. | .................... 355/72 |
| 2004/0119964 | A1 | * | 6/2004 | Poon et al. | .................... 355/72 |

FOREIGN PATENT DOCUMENTS

| JP | 11-190786 | | 7/1999 |
| JP | 11-243132 | | 9/1999 |
| JP | 2002-023764 | | 1/2002 |
| JP | 2003-023764 | * | 1/2003 |
| JP | 2003-123832 | | 4/2003 |
| JP | 2004-254489 | * | 9/2004 |

* cited by examiner

*Primary Examiner*—Alan Mathews
(74) *Attorney, Agent, or Firm*—Canon U.S.A. Inc I.P. Div

(57) ABSTRACT

A stage apparatus includes a base, a stage movable on the base in first and second directions, a first member movable relative to the base in the first direction, and a second member movable relative to the base in the second direction. The first member is placed on the second member. With this arrangement, drive reaction-forces generated due to movement of the stage can be canceled by moving the first and second members, resulting in a smaller space needed for accommodating a canceling mechanism.

8 Claims, 9 Drawing Sheets

STAGE APPARATUS, EXPOSURE APPARATUS, AND DEVICE MANUFACTURING METHOD

BACKGROUND OF THE INVENTION

1. Field of the Invention

The present invention relates to a stage apparatus, an exposure apparatus, and a device manufacturing method.

2. Description of the Related Art

There is a problem particularly in the field of equipments, like a stage apparatus for positioning an object. For a stage, it is necessary to achieve high positioning accuracy. However, reaction-forces generated upon driving a stage cause vibration and deformation of the stage, thereby affecting the positioning accuracy. In order to reduce this affect, as shown in FIG. 15, Japanese Patent Laid-Open No. 11-243132 (corresponding to U.S. Pat. No. 6,028,376) discloses a mechanism for canceling drive reaction-forces of the stage apparatus of an exposure apparatus. The exposure apparatus includes a base 109 supporting a stage 105 movable in the X- and Y-directions, respectively, with the aid of guides 107 and 121, a pair of mass bodies 113a and 113b and another pair of mass bodies 113c and 113d disposed thereto, respectively, driven in the X- and Y-axis directions. The base has a rotating mass body (not shown) disposed thereto, generating a rotating torque. With this structure, by driving the mass bodies so as to cancel the drive reaction-forces of the stage in the X- and Y-directions and the θ-direction (the rotating direction about the Z-axis), the affect of vibration caused by the drive reaction-forces is reduced.

Japanese Patent Laid-Open No. 11-190786 (corresponding to U.S. Pat. No. 6,414,742) discloses another mechanism shown in FIG. 16. A structure, in which the base 109 having the stage 105 placed thereon, is supported by an air bearing so as to be movable relative to a base 110. The base 109 has rotatable rotors 108 disposed on its side surfaces with this structure, the drive reaction-forces of the stage in the X- and Y-directions are cancelled by moving the base 109, and drive reaction-forces in the θ-direction, the ωx-direction (the rotating direction about the X-axis), and the-ωy direction (the rotating direction about the X-axis) are cancelled by rotating the rotors.

In recent years, the diameter of a wafer has been increasing for increasing productivity of devices. Accordingly, the stage has to have a larger diameter in proportion to an increase in the diameter of the wafer, and therefore a larger weight. Also, in order to increase throughput (the number of wafers processed in a unit time), it is necessary for the stage to move more quickly. To this end, the stage tends to be moved at a high acceleration. That is, the stage tends to be driven with a larger thrust force of than before due to its increased weight and higher acceleration.

With the structure of another mechanism disclosed in Japanese Patent Laid-Open No. 11-190786 in which reaction forces are canceled by moving the base 109 in the X- and Y-directions relative to the base 110, an additional space is needed by an amount equivalent to a stroke allowing the base 109 to move therealong. This causes the larger size of the overall stage apparatus and accordingly, the larger size of the exposure apparatus itself.

With this structure, the stroke of the base 109 could be reduced by making the base 109 heavier. However, in practice, the base 109 cannot be made too heavy when taking into account transportation, maintenance, and so forth of the stage apparatus.

Also, in the case where the base 109 is elevated by the air bearings, the air bearings are needed to have as large a capacity as to elevate the base 109 having a weight of several tons. Unfortunately, a larger capacity of the air bearings require a larger flow rate of feeding air, and this sometimes causes difficulty in installing the stage apparatus depending on its installation specifications.

The structure of another mechanism disclosed in Japanese Patent Laid-Open No. 11-243132, in which the base has mass bodies hung down from its side surfaces, results in an increased installation space. Also, the hanging structure of the mass bodies may cause an undesirable deformation and deterioration in posture of the base.

SUMMARY OF THE INVENTION

The present invention is directed to a stage apparatus, an exposure apparatus incorporating the same, and a device manufacturing method. In one aspect of the present invention, a stage apparatus includes a base, a stage movable on the base in first and second directions, a first member movable relative to the base in the first direction, and a second member movable relative to the base in the second direction, wherein the first member is placed on the second member.

In another aspect of the present invention, a stage apparatus includes a base, a stage movable on the base in first and second directions, a first reaction-force canceling mechanism configured to cancel reaction forces exerted on the base due to movement of the stage in the first direction, and a second reaction-force canceling mechanism configured to cancel reaction forces exerted on the base due to movement of the stage in the second direction, wherein the first and second reaction-force canceling mechanisms are arranged in a stacked manner.

According to the present invention, a stage apparatus including a reaction-force canceling mechanism for preventing deterioration in positioning accuracy caused by deformation or the like while taking account its installation space is provided.

Further features of the present invention will become apparent from the following description of exemplary embodiments with reference to the attached drawings.

DESCRIPTION OF THE EMBODIMENTS

Figure 1:
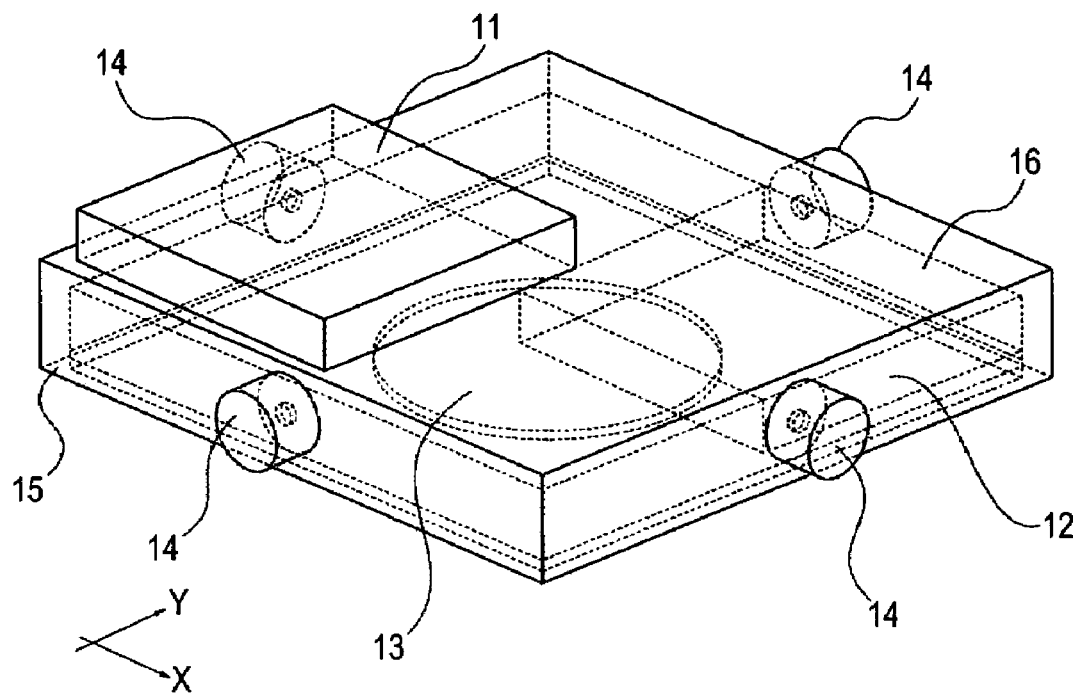
FIG. 1 is a perspective view of the overall structure of a stage apparatus including a reaction-force canceling mechanism, according to a first embodiment of the present invention.
Figure 2:
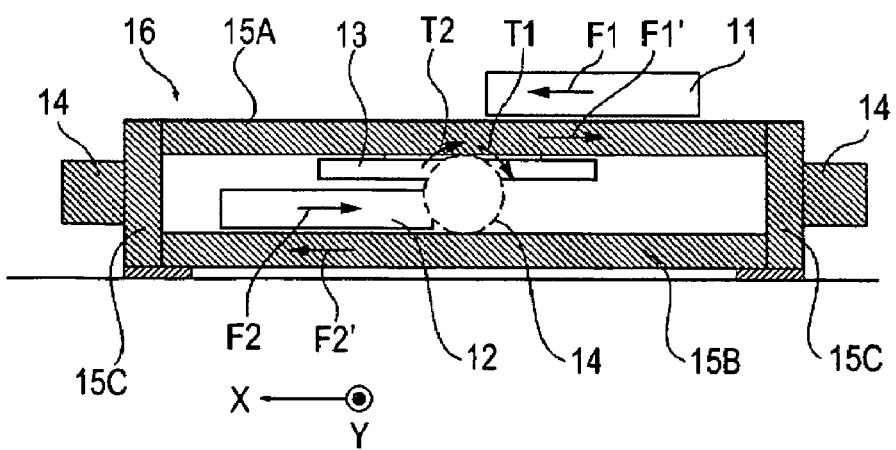
FIG. 2 is a sectional view of a base, illustrating a method for canceling reaction forces in the X- and Y-directions and those about the X- and Y-axes.

FIG. 1 is a perspective view of a stage apparatus 16 according to a first embodiment of the present invention. FIG. 2 is a sectional view of a base 15 shown in FIG. 1. The base 15 has a stage 11 on the upper surface thereof in a non-contact manner supported by an air bearing (not shown). The base 15 has a hollow structure surrounded by a top plate 15A, a bottom plate 15B, and side plates 15C arranged so as to serve as four side surfaces. A mass unit 12, serving as a mass body, is placed on the upper surface of the bottom plate 15B. The mass unit 12 is movable within the base 15 in the X- and Y-directions.

The top plate 15A, the bottom plate 15B, and the side plates 15C are integrally bonded to one another and are supported by the floor or an air mount (a vibration-free stand, not shown). When the magnitude of the floor vibration is not negligible, the stage apparatus should have the air mount incorporated therein. When the vibration is negligibly small, non-use of the air mount leads to a lower cost of the stage apparatus.

The stage 11 is movable in the X- and Y-directions with the aid of a so-called surface motor while receiving a force from the top plate 15A having a stator (not shown) of the surface motor fixed thereto. The stator may be integrated into the top plate 15A. The surface motor may be of a variable magnetic-resistance type (hereinafter, referred to as a surface pulse motor) or a Lorenz type.

The variable magnetic-resistance type includes pole teeth constituting its stator, the structure of which is disclosed in Japanese Patent Laid-Open Nos. 11-190786 and 2002-023764. The Lorenz type includes magnets or winding coils constituting its stator, the structure of which is disclosed in Japanese Patent Application No. 2003-123832. Detail descriptions of these drive mechanisms are omitted. The stage 11 may be of a type movable not only in the X- and Y-directions but also in the Z-direction, the θ-direction (the rotating direction about the Z-axis), the ωx-direction (the rotating direction about the X-axis), and the ωy-direction (the rotating direction about the Y-axis) in addition to the X- and Y-directions.

The base 15 has a rotor 13 and the mass unit 12 disposed therein for canceling, respectively, reaction moments about the Z-axis and reaction forces in the X- and Y-directions, in addition to having rotors 14 for canceling reaction moments about the X- and Y-axes.

Figure 3:
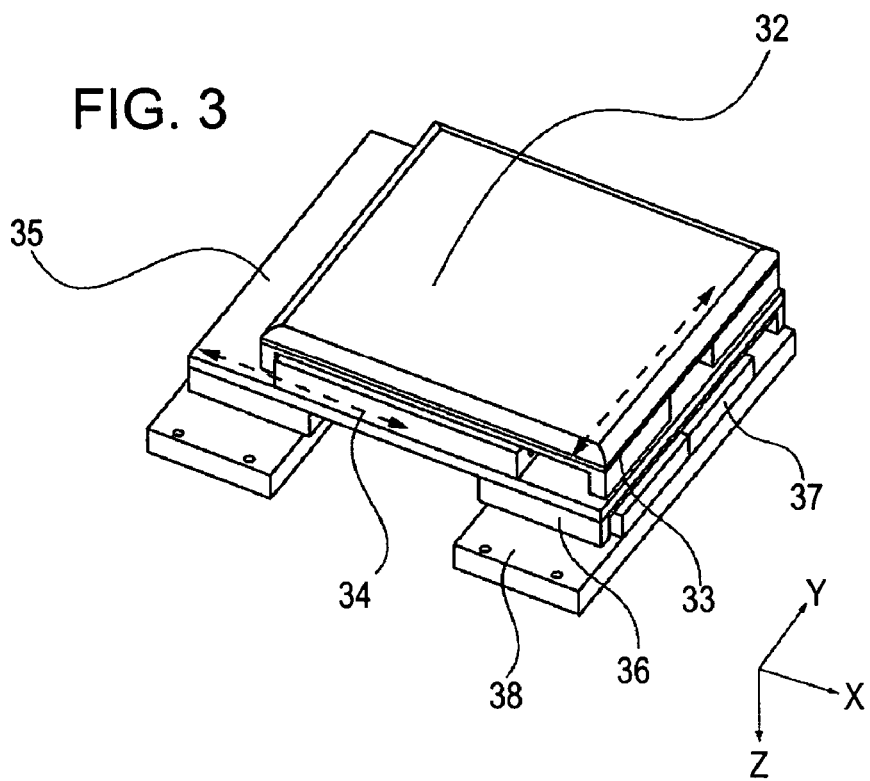
FIG. 3 is a detailed perspective view of a mass unit shown in FIG. 1.

FIG. 3 is a detailed perspective view of the mass unit 12 according to the present embodiment. The mass unit 12 includes an X-mass 32 movable in the X-direction and having an X-motor moving portion 33 disposed thereon. The mass unit 12 also includes a Y-mass 35 movable in the Y-direction and having a Y-motor moving portion 36 disposed thereon. An X-motor stationary portion 34 is fixed to the Y-mass 35 and a Y-motor stationary portion 37 is fixed to the top plate in the base via a fixing plate 38. The X- and Y-motors are of a so-called linear motor type and constrained so as to allow the X-mass 32 and the Y-mass 35 to move only in the X- and Y-directions with the aid of X- and Y-linear guides (not shown), respectively. The linear guide may be of a rolling type including balls or rollers.

A drive reaction-force of the Y-mass 35 is transferred to the base 15 via the Y-motor stationary portion 37 and the fixing plate 38, and a drive reaction-force of the X-mass 32 is transferred to the base via the X-motor stationary portion 34, the Y-mass 35, the Y-linear guide, the Y-motor stationery portion 37, and the fixing plate 38.

Reaction forces in the X- and Y-directions can be canceled by moving these masses in a direction opposite to the moving direction of the stage.

Figure 8:
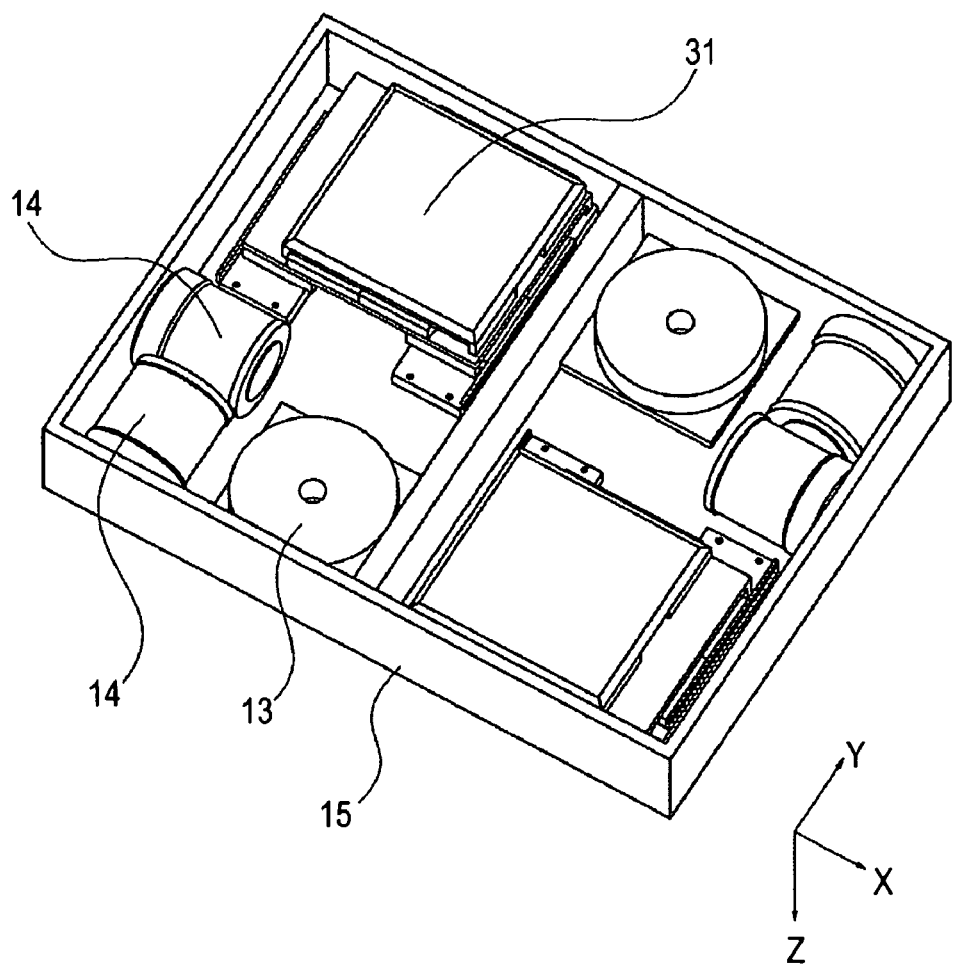
FIG. 8 is a perspective view of the base having a plurality of mass units disposed therein.

The base 15 may have two mass units 31 disposed therein as shown in FIG. 8. The number of mass units can be changed if needed in accordance with its design requirement. Also, arrangement of the rotors about the X- and Y-axes in the base results in a smaller installation space.

According to the present embodiment, since the X-mass 32 and the Y-mass 35 are arranged in a stacked manner, a reaction-force canceling mechanism can be accommodated in a smaller space, thereby providing a beneficial effect especially on the stage apparatus having the reaction-force canceling mechanism such as a mass unit disposed in the base. Also, the X-mass 32 is moved in the Y-direction together with the Y-mass 35 because of the X-mass being supported by the Y-mass, thereby bringing in an effect of an increased weight of the X-mass while inhibiting an increase in the installation space of the canceling mechanism.

Referring back to FIG. 2, a method for canceling reaction forces exerted on the stage will be described. In the following description, the X-mass 32 and Y-mass 35 are integrated into the mass unit 12 for the sake of easy explanation.

When a thrust force F1 is exerted on the stage 11 so as to accelerate it in the positive X-direction, a drive reaction-force F1' of the stage is exerted on the top plate 15A in the negative X-direction. With this, at the same time of driving the stage 11, a thrust force F2 is exerted on the mass unit 12 so as to accelerate it in the negative X-direction. As a result, a drive reaction-force F2' of the mass unit 12 is exerted on the bottom plate 15B. By adjusting these two drive reaction-forces F1' and F2' so as to be equal to each other, the drive reaction-forces exerted on the base 15 cancel each other, thereby reducing a force exerted on the base 15. In the same fashion as reducing the force exerted on the base in the X-direction, a force exerted on the base 15 in the Y-direction can be reduced.

Subsequently, a method for canceling moments of the stage will be described with reference to FIG. 2. The rotor 14 is shown by a dotted line in FIG. 2.

When the stage 11 is accelerated in the X-direction, the drive reaction-force F1' of the stage is exerted on the top plate 15A. Since the working point of the drive reaction-force F1' of the stage does not coincide with the center of gravity of the base 15, a moment T1 is exerted on the base 15. When the stage 11 is accelerated in the X-direction, a disagreement between the center of gravity of the stage and the working point of the force exerted on the stage causes a moment T (not shown) to be exerted on the stage and also on the base 15.

When the mass unit 12 is accelerated in the X-direction, the drive reaction-force F2' of the mass unit 12 is exerted on the bottom plate 15B, thereby exerting a moment T2 on the base 15. When the mass unit 12 is accelerated in the X-direction, a disagreement between the center of gravity of the mass unit 12 and the point of the mass unit where the force is exerted causes a moment T3 (not shown) to exert on the mass unit and also on the base. As a result, the sum of the clockwise or counterclockwise moments T, T1, T2, and T3 is exerted on the base. In order to cancel these moments exerted on the base, the rotors 14 disposed on the side plates 15C are rotated so as to exert a counter moment on the base. As a result, the moments exerted on the base 15 about the Y-axis can be reduced. In the same fashion as reducing the moment exerted on the base about the Y-axis, a moment exerted on the base 15 about the X-axis can be reduced.

Referring back to FIG. 3, a method for canceling moments about the Z-axis with the aid of the rotor 13 will be described.

Figure 4:
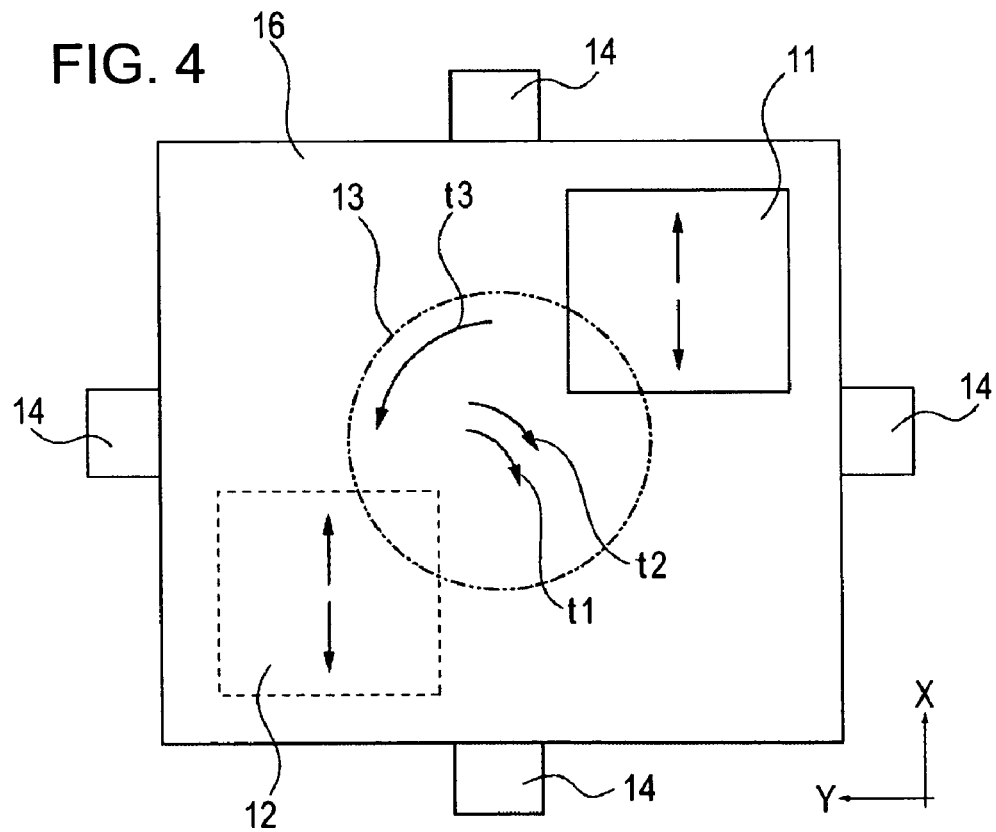
FIG. 4 is a top view of the stage apparatus, illustrating a method for canceling moments about the Z-axis.

FIG. 4 is a top view of the stage apparatus. When the stage 11 is accelerated in the positive X-direction, the drive reaction-force F1' of the stage 11 is exerted on the top plate 15A in the negative X-direction. Accordingly, a moment t1 is exerted clockwise on the base 15. When the mass unit 12 is accelerated in the negative X-direction, a moment t2 caused by the drive reaction-force F2' of the mass unit 12 is exerted clockwise on the base 15. In order to cancel these moments t1 and t2, the rotor 13 disposed on the lower surface of the top plate 15A is rotated clockwise. With this arrangement, since a counter moment t3 is exerted counterclockwise on the base 15, by adjusting the rotor 14 such that the reaction moment t3 is equal to the sum of the moments t1 and t2, a moment exerted on the base 15 about the Z-axis can be reduced.

The clockwise or counterclockwise direction in the above description is determined depending on the position of each of the stage 11 and mass unit 12 relative to the center of gravity of the base 15.

Also, by arranging the stage 11 and mass unit 12 such that the center of gravity of the overall stage apparatus 16 shown in FIG. 1 is positioned at the center of the base 15, even when the stage 11 and the mass unit 12 are moved, moments generated by the moving loads can be made zero. In this case, an additional system for compensating for the moving loads is eliminated.

In the present embodiment, since the base 15 has a guide surface (the upper surface of the top plate 15A) supporting the stage 11 and another guide surface (the upper surface of the bottom plate 15B) guiding the mass unit 12 moving so as to cancel reaction forces exerted on the base 15 in accordance with the movement of the stage 11, in a direction parallel to each axis, the stage is unlikely to suffer from external influences such as deformation of the base caused by the movement of the mass unit.

Also, since the base 15 has a hollow structure and the mass unit 12 is accommodated therein, in addition to the above advantage, the base is not needed to move with a large stroke so as to cancel reaction forces. Also, the canceling mechanism is prevented from requiring a larger installation space needed for external attachment of the mass unit to the base.

Further, since, other than the mass unit 12, the base 15 includes the rotors moving so as to cancel rotational reaction forces exerted on the base in accordance with the movement of the stage, reaction forces in rotating directions about the respective axes as well as directions parallel to the axes can be canceled. As a result, a mechanism for canceling reaction forces in directions parallel to and about the respective axes is achieved while inhibiting increase in the installation space for the canceling mechanism.

Still further, since the base 15 has a structure in which the top plate 15A guiding the stage and the bottom plate 15B guiding the mass unit are connected by the side plates 15C, effects of movements of the stage and the mass unit are dispersed in each of the plate-like members, thereby preventing a local deformation and the like of the base.

Since the guide surfaces of the base for the stage and the mass unit serve also as the supporting surface for the same, an effect of reducing the deformation and an external disturbance is further significant.

With this arrangement in which the stage is movable relative to the base with the aid of the surface motor, the overall stage apparatus has a simple structure while inhibiting increase of its installation space. In addition, an effect caused by deformation of the guides and the like is small, resulting in high positioning accuracy.

Figure 5:
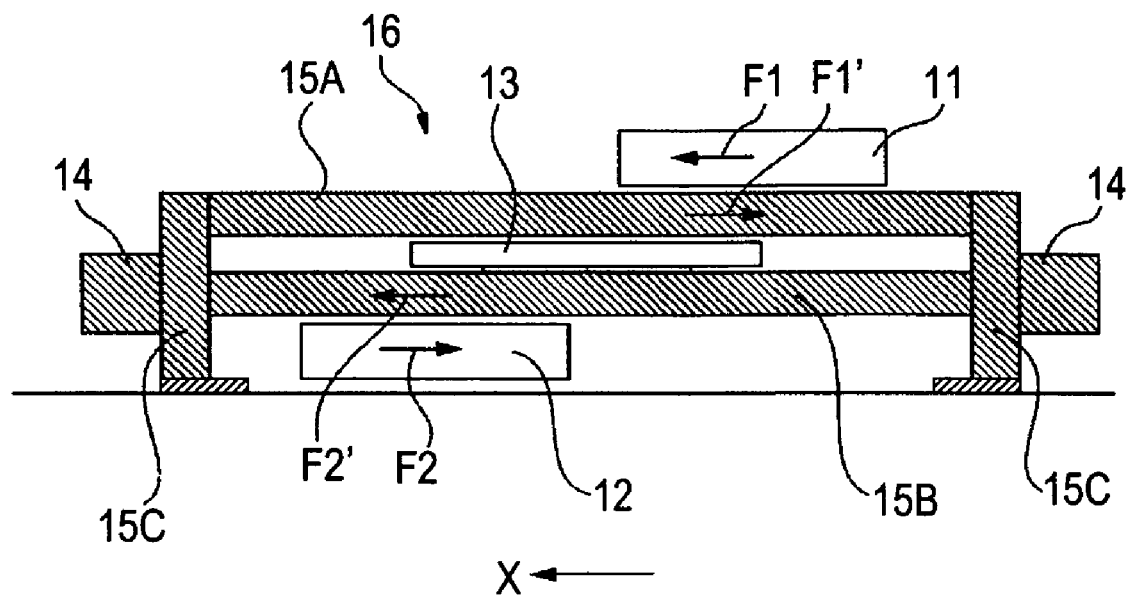
FIG. 5 is a sectional view of a modification of the stage apparatus, having the mass unit placed on the lower surface of the bottom plate of the base.
Figure 6:
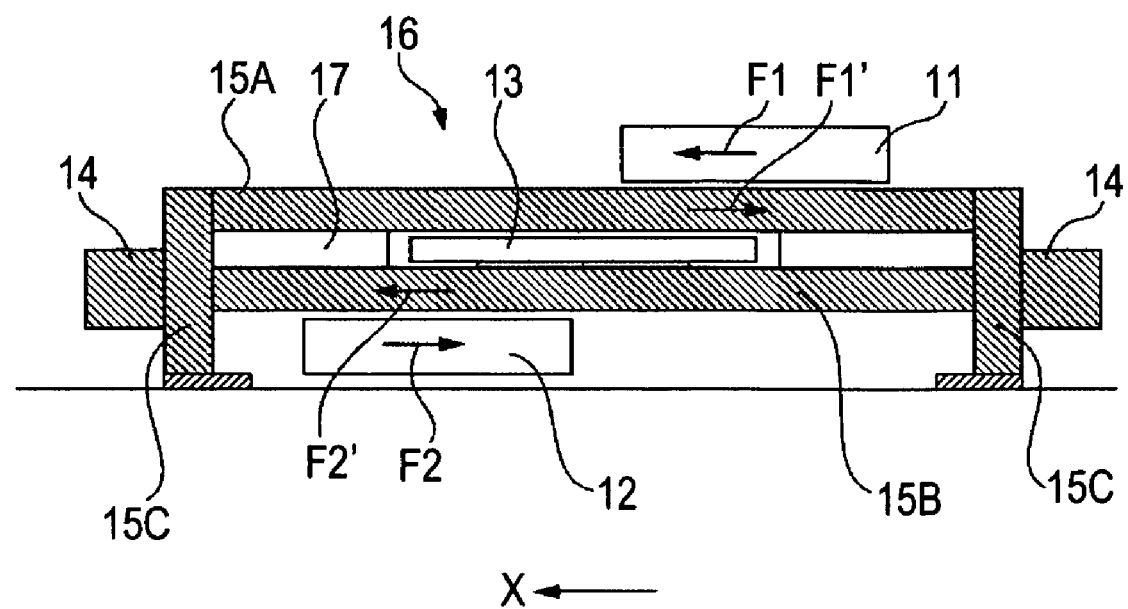
FIG. 6 is a sectional view of another modification of the stage apparatus, having a damper disposed between the top and bottom plates of the base disposed in the structure shown in FIG. 5.
Figure 7:
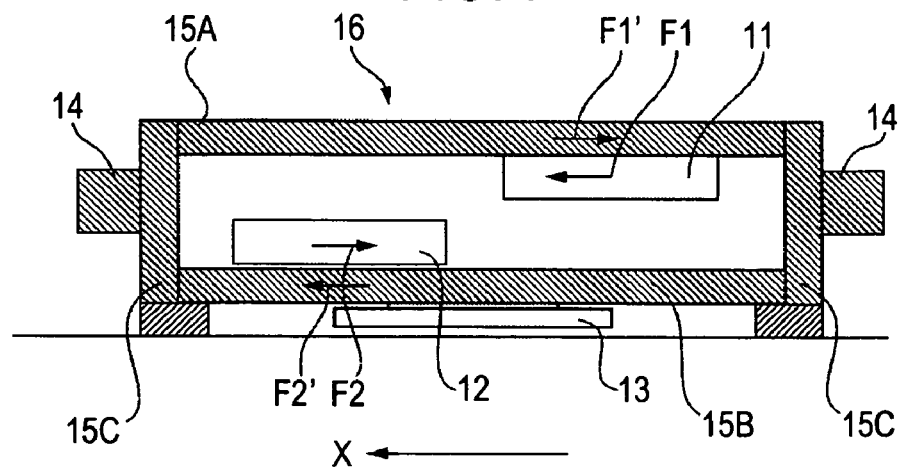
FIG. 7 is a sectional view of another modification of the stage apparatus, having a stage and the mass unit disposed in the base.

FIGS. 5 to 7 show modifications of the stage apparatus according to the first embodiment. In the following modifications, the stage 11, the mass unit 12, and the rotor 13 are supported at different positions from one another.

While the rotor 13 is disposed on the lower surface of the top plate 15A of the stage apparatus according to the first embodiment shown in FIG. 2, the rotor 13 of the modification shown in FIG. 5 is disposed on the bottom plate 15B. By arranging the rotor 13 for canceling reaction forces in the rotating direction about the Z-axis so as to be supported by a member different from the top plate 15A guiding the stage 11 as described above, the stage 11 is prevented from an affect of a self-weight deformation of the rotor 13.

By arranging the mass unit 12 on the lower surface of the bottom plate 15B, the mass unit can be placed on the surface of a base, thereby preventing a local deformation of the mass unit.

Because of serving so as to cancel reaction forces, the mass unit 12 is needed to receive drive forces from the side of the bottom plate 15B. The drive force can be obtained by a linear motor having a guide or by a so-called surface motor having no guide.

The modification of the stage apparatus shown in FIG. 6 has a structure in which the stage, the mass unit, and the rotor are supported in the same fashion as in the modification shown in FIG. 5, and the top plate 15A and the bottom plate 15B have a damper interposed therebetween. With this arrangement, advantages of damping vibration generated in the respective plate-like members so as to reduce transfer of vibration between the adjacent plate-like members are expected.

The modification of the stage apparatus shown in FIG. 7 has an example structure in which the stage 11 is disposed on the lower surface of the top plate 15A; the mass unit 12 is disposed on the upper surface of the bottom plate 15B; and the rotor 13 is disposed on the lower surface of the bottom plate 15B.

Figure 9:
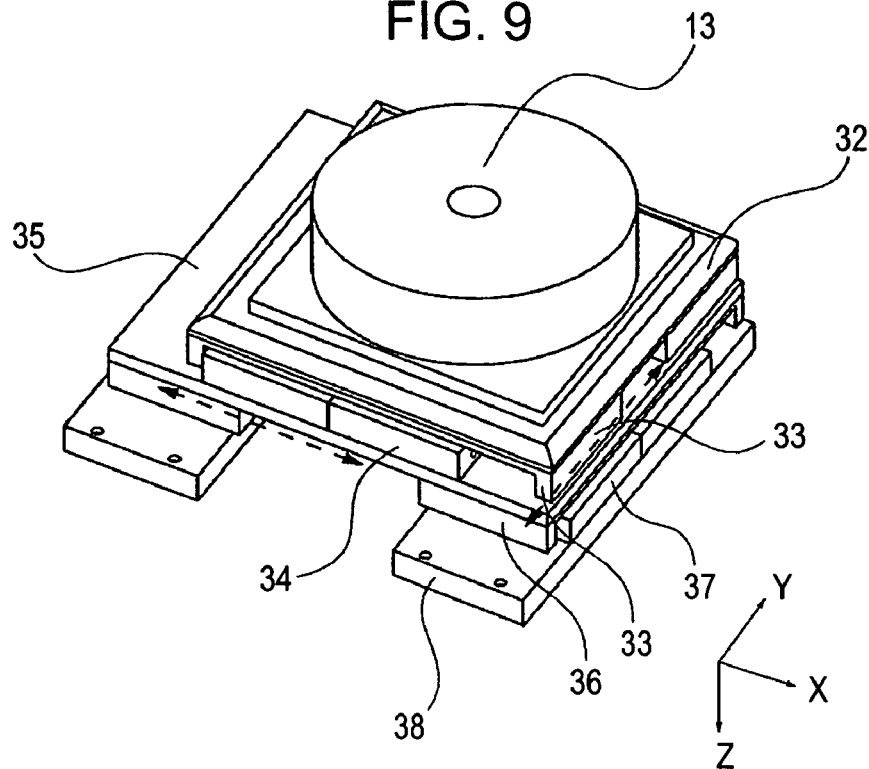
FIG. 9 is a perspective view of another modification of the stage apparatus, having a rotor disposed on the mass unit, rotatable about the Z-axis.

FIG. 9 shows another modification of the stage apparatus, having the rotor 13 for canceling reaction moments about the Z-axis disposed on the X-mass 32. The reaction moments about the Z-axis are transferred to the base 15 via the fixing portion of the rotor 13 fixed to the X-mass 32, the Y-mass 35, the linear guides, and so forth.

By arranging the rotor 13 for canceling the reaction moments about the Z-axis on the X-mass 32 as described above, while the Y-mass 35, the X-mass 32, and the rotor 13 are moved in the Y-direction, the X-mass 32 and the rotor 13 are moved in the X-direction, resulting in an increased weight effect of these masses while inhibiting increase in the installation space of the canceling mechanism.

Figure 10:
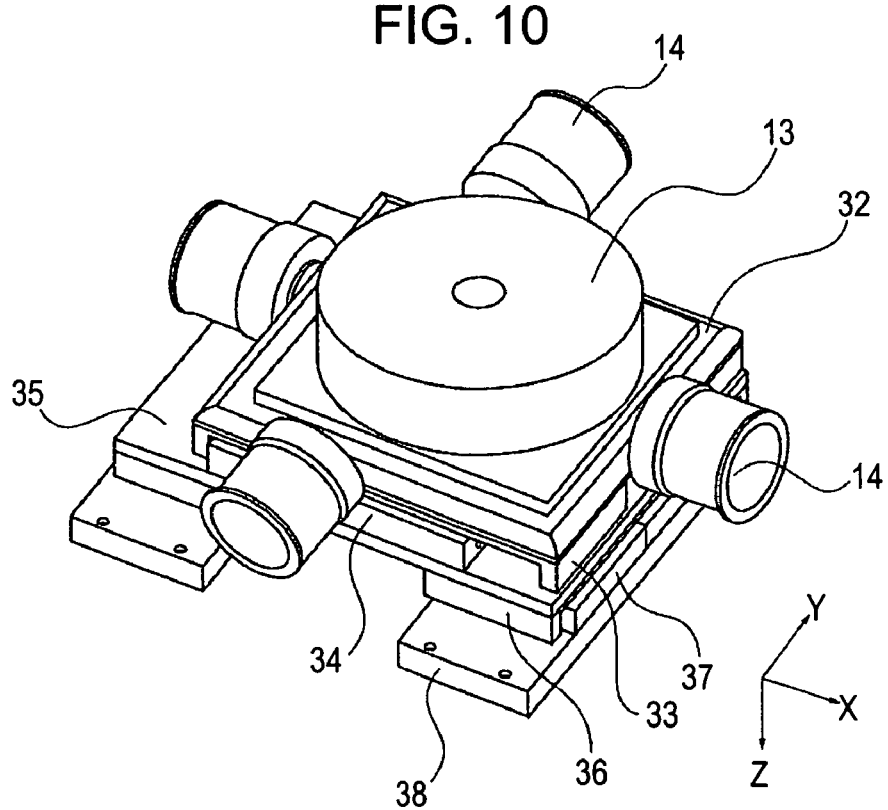
FIG. 10 is a perspective view of another modification of the stage apparatus, having rotors disposed on the mass unit, respectively rotatable about the X- and Y-axes.

FIG. 10 shows another modification of the stage apparatus, having the rotors 14 for canceling reaction moments about the X- and Y-axes disposed on the X-mass 32. The reaction moments about the X- and Y-axes are transferred to the base 15 via the fixing portions of the rotors 14 fixed to the X-mass 32, the Y-mass 35, the linear guides, and so forth.

By arranging the rotors 14 for canceling the reaction moments about the X- and Y-axes on the X-mass 32 as described above, while the Y-mass 35, the X-mass 32, and the rotors 13 and 14 are moved in the Y-direction (because of support of the X-mass and the rotors by the Y-mass), the X-mass 32 and the rotors 13 and 14 are moved in the X-direction (because of support of the rotors by the X-mass), resulting in an increased weight effect of these masses while inhibiting increase in the installation space of the canceling mechanism.

Figure 11:
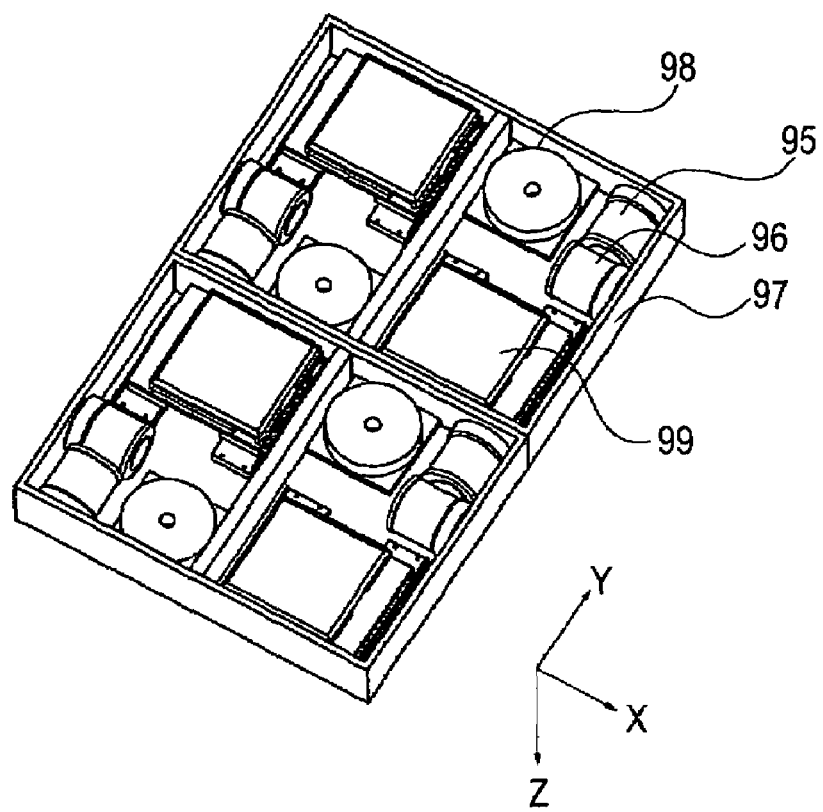
FIG. 11 is a perspective view of a stage apparatus according to a second embodiment of the present invention, including an example stage having a two-divided section structure.

FIG. 11 shows the inside of a base 97, having a plurality of stages disposed therein, of a stage apparatus according to a second embodiment of the present invention.

Inside the base 97, a rotor counter 98 for canceling moments about the Z-axis, a rotor counter 95 for canceling moments about the Y-axis, and a rotor counter 96 for canceling moments about the X-axis are disposed. A reaction force and a reaction moment of a stage (not shown) moving on the base 97 are canceled by mass units 99 and counter rotors 95, 96, and 98 disposed in the base 97.

The base 97 has a structure in which each mass unit 99 is configured by stacking an X-mass on a Y-mass similar to that in the first embodiment, thereby achieving a space-saving canceling mechanism. Also, the counter rotors may be stacked on the mass units as illustrated in the modifications of the stage apparatus according to the first embodiment.

Since the base 97 has a two-divided section structure, reaction forces can be canceled by each section, thereby reducing transfer of vibration between two sections.

Example Application to Exposure Apparatus

Figure 12:
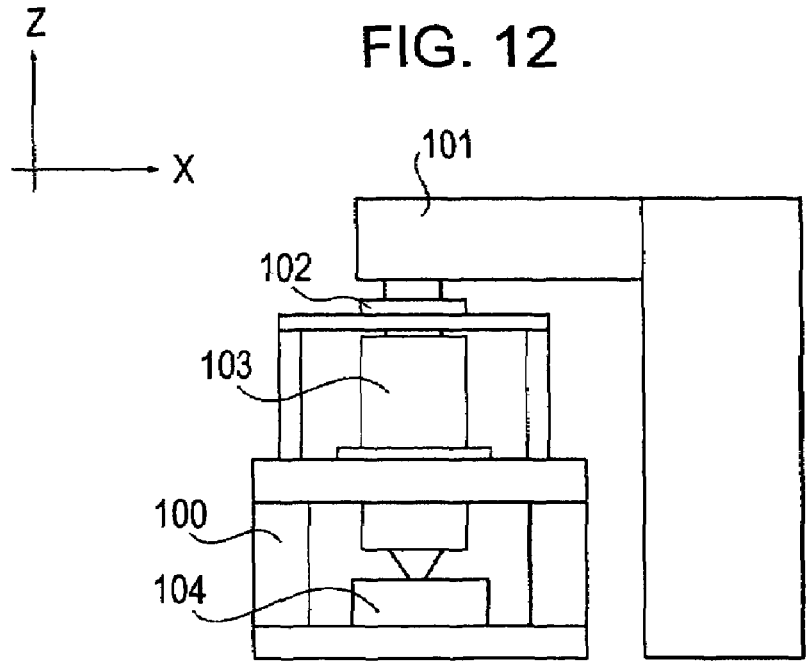
FIG. 12 is a schematic sectional view of an exposure apparatus.

FIG. 12 shows an example application of the foregoing stage apparatus to an exposure apparatus for use in fabricating semiconductor devices.

The exposure apparatus is used for fabricating semiconductor devices such as semiconductor integrated circuits, each having a fine pattern such as a micro-machine or a thin-film magnetic head, and includes an illumination system unit 101, a reticle stage 102, a projection lens (a generic term of a refractive lens, a catadioptric lens system lens, a charged-particle lens, and the like) 103 serving as a projection system, and a wafer stage 104. By illuminating exposure light (a generic term of visible light, ultraviolet light, extreme-ultraviolet (EUV) light, an X-ray, an electron beam, a charged-particle beam, and the like) serving as exposure energy and emitted from the illumination system unit 101 onto a semiconductor wafer W serving as a substrate via a reticle of an original plate and the projection lens 103, a desired pattern is formed on the substrate placed on the wafer stage 104.

While holding the wafer W serving as a substrate on a chuck placed on the wafer stage 104, with the aid of the illumination system unit 101, the pattern of the reticle of an original plate placed on the reticle stage 102 is transferred onto each part on the wafer W by a step-and-repeat method or a step-and-scan method.

The exposure apparatus also includes an alignment scope (not shown) for positioning each of shots in the wafer and for aligning the wafer W with the reticle. In the case where alignment and exposure steps are conducted in parallel to each other, the exposure apparatus can include two stages.

By applying the stage apparatus to the wafer stage or the reticle stage, or both of them, the exposure apparatus offers improved accuracy without requiring a wider installation area.

Device Manufacturing Method

Figure 13:
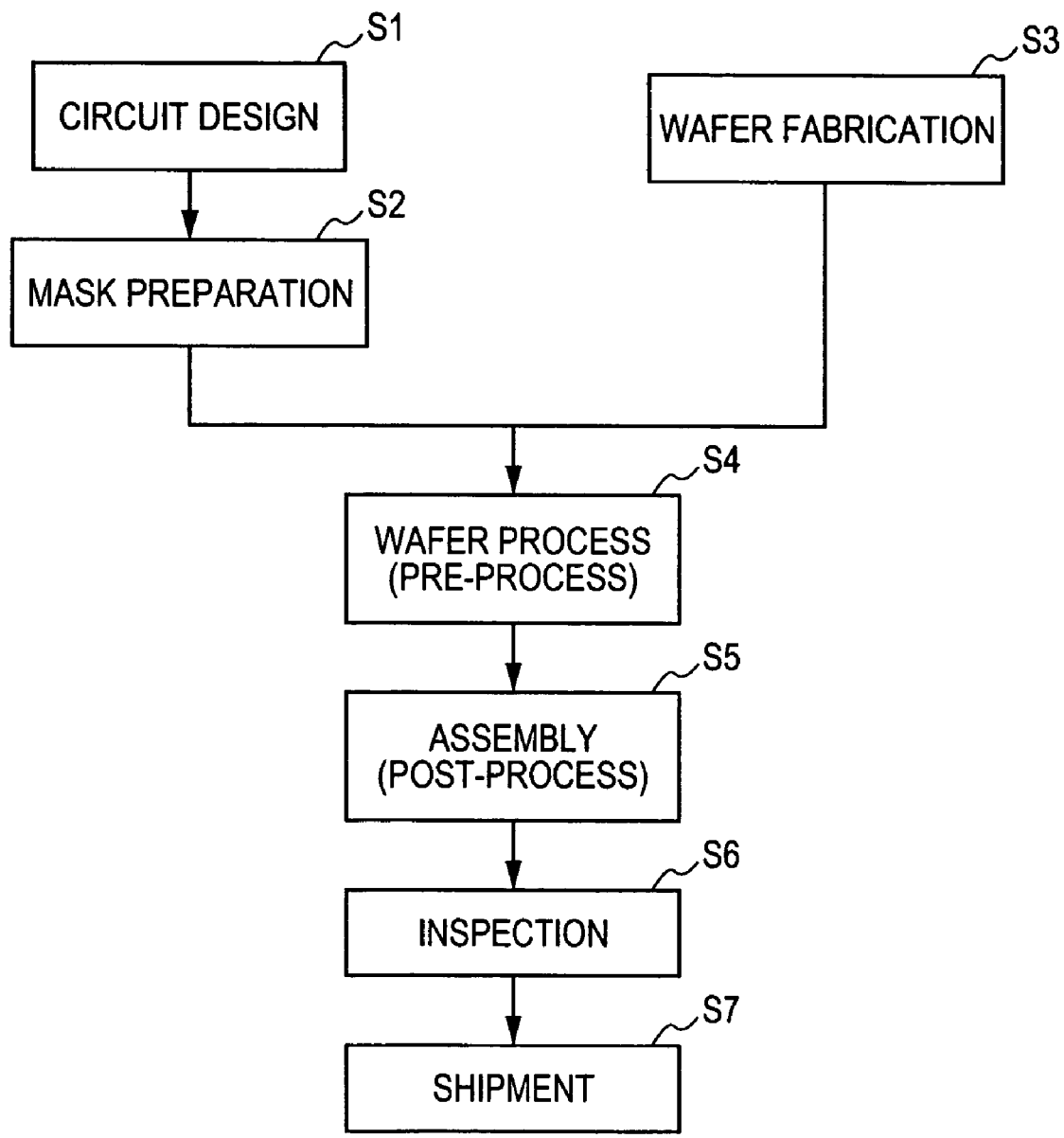
FIG. 13 is a flowchart of a semiconductor-manufacturing process.

Referring now to FIG. 13, a process for fabricating a semiconductor device with the aid of the exposure apparatus will be described. FIG. 13 is a flowchart of the overall process for fabricating a semiconductor device. A circuit design for the semiconductor device is conducted in step S1 (circuit design). A mask is prepared in step S2 (mask preparation) on the basis of the designed circuit pattern.

Meanwhile, a wafer is fabricated in step S3 (wafer fabrication) with materials including silicon. With the aid of the exposure apparatus, an actual circuit is formed in step S4 (wafer process) called a pre-process, on the wafer by lithography. The wafer fabricated in step S4 is made into semiconductor chips in step S5 (assembly) called a post-process. An assembly step (dicing and bonding), a packaging step (chip sealing), and the like are included in step S5. Inspections such as an operation-checking test and a durability test, of the semiconductor device fabricated in step S5 is conducted in step S6 (inspection). The semiconductor devices completed after undergoing these steps are shipped in step S7.

Figure 14:
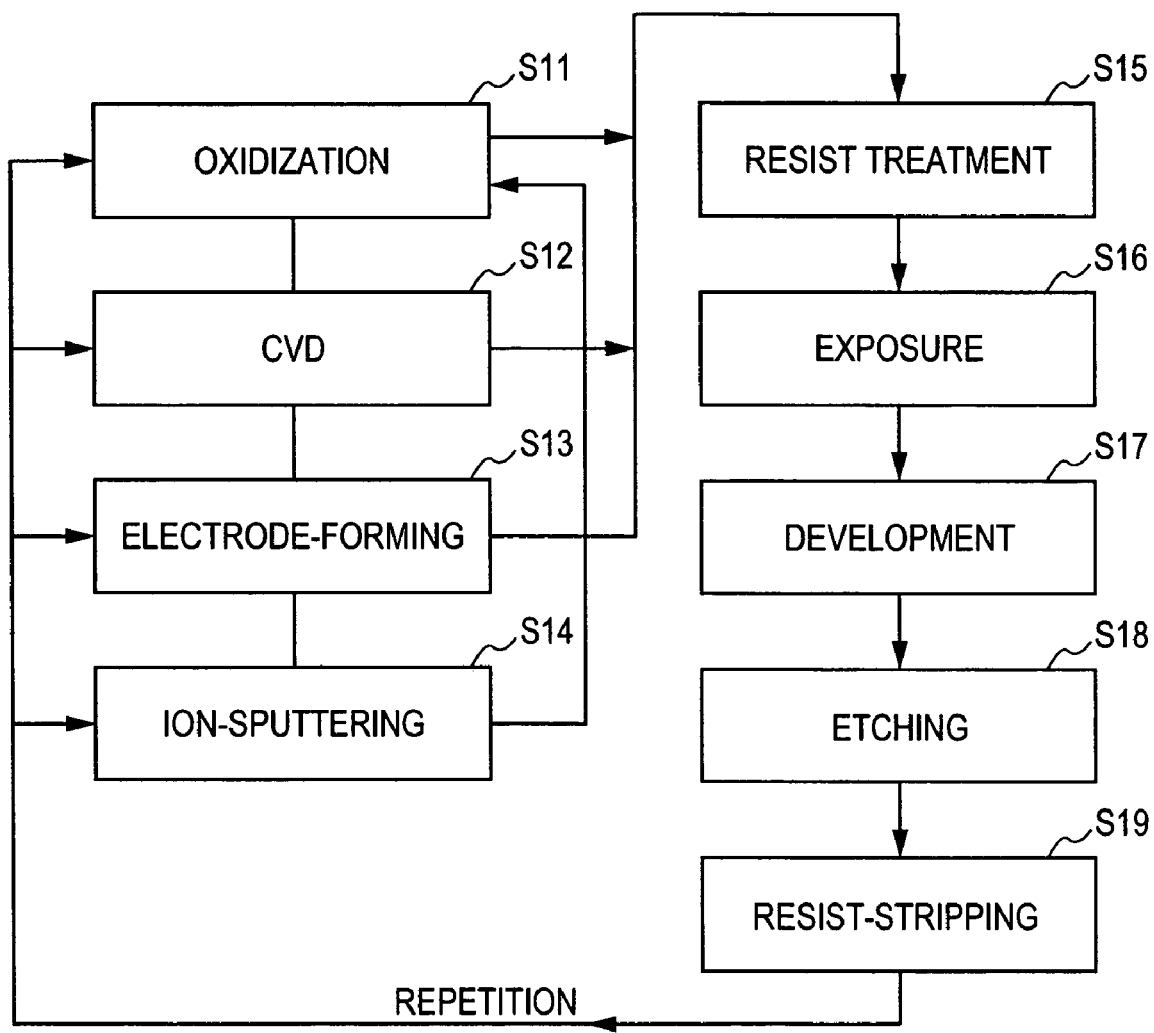
FIG. 14 is a flowchart of a wafer-fabricating process.
Figure 15:
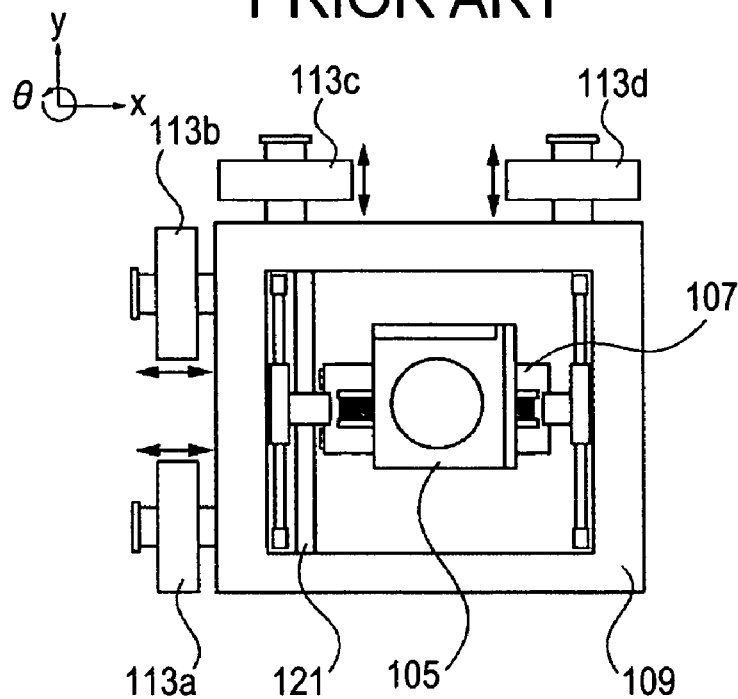
FIG. 15 is a perspective view of a known stage apparatus.
Figure 16:
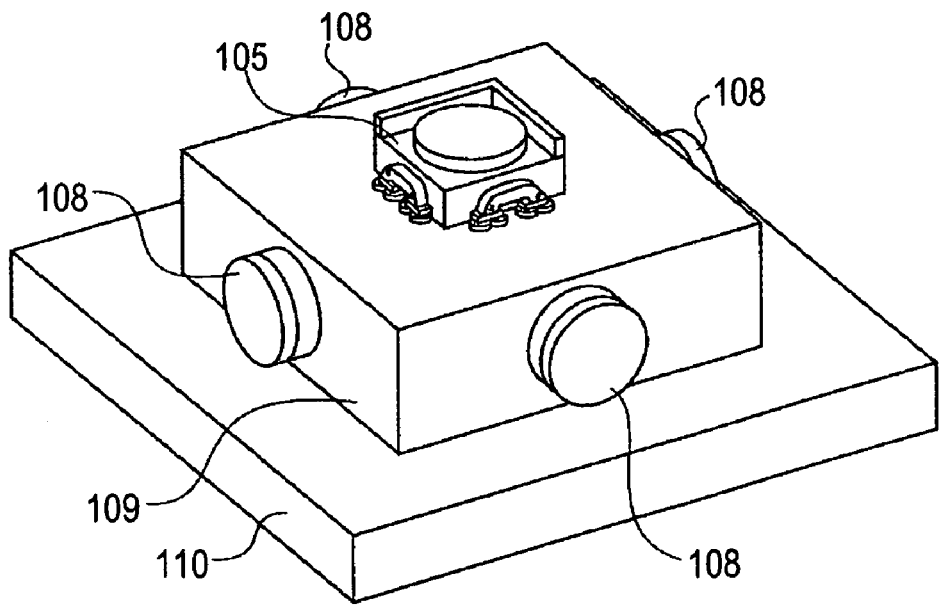
FIG. 16 is a perspective view of another known stage apparatus.

As shown in FIG. 14, the following steps are included in the foregoing step S4 (wafer process): an oxidization step S11 for oxidizing the surface of the wafer; a chemical vapor deposition (CVD) step S12 for depositing an insulating film on the wafer surface; an electrode-forming step S13 for forming electrodes on the wafer by deposition; an ion-sputtering step S14 for sputtering ions into the wafer; a resist treatment step S15 for applying an photosensitive agent on the wafer; an exposure step S16 for transferring a circuit pattern by the exposure apparatus, onto the wafer having undergone the resist treatment step S15; a development step S17 for developing the wafer having exposed in the exposure step S16; an etching step S18 for scraping a part of the wafer other than its resist image part having developed in the development step S17 off the surface of the wafer; and a resist-stripping step S19 for stripping an unnecessary resist having undergone the etching step. By repeating these steps, circuit patterns are formed on the wafer in a multiply layered manner.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2004-299785 filed Oct. 14, 2004, which is hereby incorporated by reference herein in its entirety.

What is claimed is:

1. A stage apparatus, comprising:
   a base;
   a stage movable on the base in first and second directions;
   a first mass body movable in the first direction so as to cancel a reaction force acting on the base according to a movement of the stage; and
   a second mass body movable in the second direction so as to cancel a reaction force acting on the base according to a movement of the stage,
   wherein the base has an inner space defined therein, and the first and second mass bodies are arranged in the inner space, and
   wherein the first mass body is placed on the second mass body.

2. The stage apparatus according to claim 1, further comprising a rotor rotating so as to cancel reaction moments exerted on the base due to movement of the stage.

3. The stage apparatus according to claim 2, wherein the rotor is arranged in the inner space.

4. The stage apparatus according to claim 1, further comprising a surface motor driving the stage.

5. The stage apparatus according to claim 1, wherein the stage is a plurality of stages supported by the base.

6. An exposure apparatus for exposing a pattern of an original plate onto a substrate, the exposure apparatus comprising the stage apparatus according to claim 1 facilitating positioning at least one of the original plate and the substrate.

7. A device manufacturing method, comprising the steps of:
   exposing a pattern onto a substrate with the exposure apparatus according to claim 6; and
   developing the exposed substrate.

8. A stage apparatus, comprising:
   a base;
   a stage movable on the base in first and second directions;
   a first reaction-force canceling mechanism configured to cancel reaction forces exerted on the base due to movement of the stage in the first direction; and
   a second reaction-force canceling mechanism configured to cancel reaction forces exerted on the base due to movement of the stage in the second direction,
   wherein the base has an inner space, and the first and second reaction-force canceling mechanisms are arranged in the inner space, and
   wherein the first and second reaction-force canceling mechanisms are arranged in a stacked manner.

* * * * *